US009933295B2

(12) United States Patent
Fish et al.

(10) Patent No.: US 9,933,295 B2
(45) Date of Patent: *Apr. 3, 2018

(54) MONITORING SYSTEMS AND METHODS

(71) Applicant: TDG AEROSPACE, INC., Escondido, CA (US)

(72) Inventors: Daniel E. Fish, Longview, WA (US); David L. Evans, San Diego, CA (US); Todd B. Skinner, Lakeside, CA (US); Andrew Wagner, San Marcos, CA (US); Adrian Alting-Mees, Cardiff, CA (US)

(73) Assignee: TDG AEROSPACE, INC., Escondido, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/257,612

(22) Filed: Sep. 6, 2016

(65) Prior Publication Data

US 2016/0370223 A1    Dec. 22, 2016

Related U.S. Application Data

(63) Continuation of application No. 14/571,155, filed on Dec. 15, 2014, now Pat. No. 9,435,698.
(Continued)

(51) Int. Cl.
*G01K 1/06* (2006.01)
*G01H 1/00* (2006.01)
(Continued)

(52) U.S. Cl.
CPC ............. *G01H 1/003* (2013.01); *G01K 13/00* (2013.01); *G01M 7/00* (2013.01);
(Continued)

(58) Field of Classification Search
CPC .. G01K 2215/00; G01K 2217/00; G01K 7/00; G01K 2007/166; G01R 31/34
(Continued)

(56) References Cited

U.S. PATENT DOCUMENTS 5,689,248 A * 11/1997 Esfahani .................. G01V 3/34
340/853.1
5,726,911 A    3/1998 Canada et al.
(Continued)

OTHER PUBLICATIONS

International Search Report and Written Opinion, PCT/US2014/070409, dated Mar. 18, 2015.
(Continued)

*Primary Examiner* — Lisa Caputo
*Assistant Examiner* — Nathaniel T Woodward
(74) *Attorney, Agent, or Firm* — Winston & Strawn LLP

(57) ABSTRACT

A monitoring system includes a plurality of modules to sense temperature and vibrations of a motor assembly, a hub computer to collect the sensed temperature and vibrations, and an analyzer computer to analyze the collected temperature and vibrations. The modules contain detectors that measure a temperature and vibrations in three axes of the motor assembly, a transceiver integrated circuit that measures a die temperature of the transceiver integrated circuit, a microcontroller integrated circuit that self-adjusts its clock pulses, and a memory that stores parameters set for the operation of the modules. The microcontroller integrated circuit and the memory are configured to check parameters corruption upon transferring the parameters from the memory to the microcontroller integrated circuit and prior to utilizing by the microcontroller integrated circuit. The microcontroller integrated circuit is also configured to perform power control operations by turning off sections of the microcontroller integrated circuit over periodic durations.

14 Claims, 11 Drawing Sheets

Related U.S. Application Data

(60) Provisional application No. 61/916,592, filed on Dec. 16, 2013, provisional application No. 62/059,781, filed on Oct. 3, 2014.

(51) Int. Cl.
    *G01K 13/00* (2006.01)
    *G01M 7/00* (2006.01)
    *G05B 23/02* (2006.01)
    *G01R 31/34* (2006.01)

(52) U.S. Cl.
    CPC ..... *G05B 23/0235* (2013.01); *G01K 2205/00* (2013.01); *G01R 31/343* (2013.01)

(58) Field of Classification Search
    USPC ........... 374/141, 142, 156, 152, 117, 170, 1; 340/870.17; 702/130, 132, 179, 99
    See application file for complete search history.

(56) References Cited

U.S. PATENT DOCUMENTS

| | | | |
|---|---|---|---|
| 5,852,351 A | 12/1998 | Canada et al. | |
| 6,128,318 A * | 10/2000 | Sato | G06F 1/14 370/503 |
| 7,055,055 B1 | 5/2006 | Schneider et al. | |
| 8,466,638 B2 * | 6/2013 | Klemm | A61C 17/221 15/167.1 |
| 2004/0263342 A1 * | 12/2004 | Matlock | H02H 7/0822 340/648 |
| 2006/0238332 A1 | 10/2006 | Carle et al. | |
| 2007/0056074 A1 * | 3/2007 | Esses | A41D 1/04 2/69 |
| 2010/0076714 A1 | 3/2010 | Discenzo | |
| 2011/0131003 A1 | 6/2011 | Tusvik | |
| 2011/0316691 A1 | 12/2011 | Pepin et al. | |
| 2012/0056711 A1 | 3/2012 | Hanrahan et al. | |
| 2012/0095622 A1 | 4/2012 | Lynch et al. | |
| 2012/0095703 A1 | 4/2012 | Zakrzewski et al. | |
| 2013/0007936 A1 * | 1/2013 | Levine | A61B 5/11 2/6.6 |
| 2015/0168268 A1 | 6/2015 | Fish et al. | |

OTHER PUBLICATIONS

Supplementary European Search Report, EP14872404, dated Jun. 29, 2017.

* cited by examiner

MONITORING SYSTEMS AND METHODS

CROSS REFERENCE TO RELATED APPLICATIONS

This application is a continuation of application Ser. No. 14/571,155 filed Dec. 15, 2014, which is a claims the benefit of U.S. Provisional Application No. 61/916,592, filed on Dec. 16, 2013 and U.S. Provisional Application No. 62/059,781, filed Oct. 3, 2014. The entire content of each application are expressly incorporated herein by reference thereto.

FIELD OF INVENTION

The present application relates to the field of monitoring mechanical systems having multiple motor assemblies in a closed geographic area, in particular with innovative techniques for monitoring the current operating status of the motor assemblies.

BACKGROUND OF THE INVENTION

Known prior art systems have been deficient in meeting the combination of performance, cost, and durability in the field monitoring systems for mechanical motor operation in industrial applications having critical fire or operational demands. Known systems have deficiencies such as they often times implement complex processing at a sensor assembly which can drain battery power and may delay the rate of reporting of conditions to a central device. Such systems are also often times bulky or have a significant profile for the purpose of ease of manufacture or ease of maintenance (e.g., so that a technician can easily access all components by opening the sensor assembly). Known systems are also often times deficient because they lack the necessary robust wireless capability and power requirements to be able to carry out higher level protocol functionality and to cover contiguous physical areas with potentially lower power transceivers. Accuracy is also an area of significant focus to assist companies. These and other deficiencies are evident in the prior art.

SUMMARY OF THE INVENTION

According to principles of the present invention, a monitoring system for monitoring a group of motors in a closed geographic area to determine an operating condition of the motor assemblies is provided. The monitoring system comprises a plurality of modules, a hub computer, and an analyzer.

The modules are adapted to be mounted to a motor assembly to sense vibrations generated by the motor assembly and sense temperature in close proximity to the motor assembly. Each module comprises a shield, an enclosure, a temperature sensor, a vibrations sensor, a microcontroller integrated circuit, transceiver integrated circuit, a battery holder and a battery, and a printed circuit board. The temperature sensor generates a temperature signal specifying a sensed temperature. The vibrations sensor senses vibrations existing in three axes and generates three vibration signals specifying vibrations measurement in x, y, and z axis's. The microcontroller integrated circuit is configured to receive the temperature and vibrations signals and transmit the temperature and vibrations signals to external points. The microcontroller integrated circuit is also configured to perform power control operations by turning off sections of the microcontroller integrated circuit over periodic durations to save battery life and to automatically turn on the sections of the microcontroller integrated circuit when a significant temperature event is determined to be an emergency by the microcontroller integrated circuit, when a significant vibration event is determined to be an emergency by the vibrations sensor, or when both emergencies are determined. The transceiver integrated circuit is implemented with a wireless mesh network protocol and is configured to receive and transmit the temperature and vibrations signals and a battery level signal. The battery holder is mounted to the printed circuit board running lengthwise across the printed circuit board and the microcontroller integrated circuit is mounted on the printed circuit board in between the battery holder and the printed circuit board. Each module has a dimension that is approximately 8-9 inches long, 1-2 inches wide, and 1-2 inches deep.

The hub computer is configured to collect the temperature and vibrations signals via the network protocol from the modules and to send the collected temperature and vibrations signals.

The analyzer computer is configured to receive the collected temperature and vibrations signals from the huh computer and process the collected temperature and vibrations signals by determining whether a threshold is reached and generating an alert when the temperature or vibration of the module measuring the motor assembly is above the threshold.

Variations of the system can have fewer or additional components or can include different combinations of the features or structures described herein are also contemplated.

In one embodiment, the wireless mesh network protocol is DUST mesh network. In one embodiment, the microcontroller integrated circuit further contains an RC network clock source that generates clock pulses. In another embodiment, the microcontroller integrated circuit is also set up to self-adjust to match the clock pulses of the RC network to clock pulses of the transceiver integrated circuit. When the clock pulses of the microcontroller integrated circuit are faster than the clock pulses of the transceiver integrated circuit, the microcontroller integrated circuit applies a correction to slow the clock pulses of the RC network and vice versa. The set-up comprises configuring the microcontroller integrated circuit to receive the clock pulses of the transceiver integrated circuit and utilizing the internal registers of the microcontroller integrated circuit and a software provided to the microcontroller integrated circuit. While the microcontroller integrated circuit may depend on the transceiver integrated circuit to correct the clock pulses produced by its RC network, the microcontroller integrated circuit and the transceiver integrated circuit perform their own functions independent of each other.

In one embodiment, the monitoring system further comprises a memory that stores parameters set for the operation of the modules. In another embodiment, the parameters comprise an acquisition rate, units of measurement for temperature, units of measurement for vibrations, and temperature and vibrations thresholds. In yet another embodiment, the parameters are further transferred to the microcontroller integrated circuit.

In one embodiment, the parameters are checked for corruption after the transfer. The check is performed by the memory generating three copies of the parameters, by the microcontroller integrated circuit requesting all of the three copies, checking if all of the three copies are identical, and storing two of those three copies in the internal RAM of the microcontroller integrated circuit if all of the three copies are identical.

In one embodiment, the parameters are checked for corruption before being used by the microcontroller integrated circuit. The check is performed by the memory generating three copies of the parameters, by the microcontroller integrated circuit requesting all of the three copies, storing two of those three copies in the internal RAM of the microcontroller integrated circuit, checking if the two copies are identical, and performing a process in which two new copies are generated from the memory and transferred to the internal RAM of the microcontroller integrated circuit to replace the two copies if the two copies are not identical.

In one embodiment, the modules further comprise another temperature sensor measuring a die temperature of the temperature sensor. In another embodiment, the modules transmit both the die temperature and the sensed temperature to the hub computer. In one embodiment, the modules are configured to have an operating temperature of approximately −40° C. to +80° C.

The system can be further enhanced by installed a remote module that senses and reports the inline frequency of a variable frequency drive signal that is applied to a motor to drive the motor. The sense frequency represented actual inline operation state is associated with the sensed vibrations resulted from the applying the variable frequency drive to the motor. If desired, the system is desired to receive the frequency data that in response to set the frequency that is applied to that monitored motor based on the vibrational data receives from the vibration sensors for that motor. The power sensor module receives a current signal representative of a variable drive frequency applied to a motor assembly and is configured to sense a frequency of the variable drive frequency by detecting zero crossing events in the current signal and wirelessly transmit the sensed frequency in the same sensed network as the other modules.

Various embodiments, different combinations of features (adding, removing, or combining different features), or other applications of the technology are also contemplated. For example, a module can be used with other devices such as a diagnostic forecasting system that forecasts expected life of mechanical components or the mechanisms for maintaining timing between chips or verifying accuracy of data can be used in other devices or applications if desired.

BRIEF DESCRIPTION OF THE DRAWINGS

The nature and various advantages of the present invention will become more apparent upon consideration of the following detailed description, taken in conjunction with the accompanying drawings, in which like reference characters refer to like parts throughout, and in which.

DETAILED DESCRIPTION OF THE PREFERRED EMBODIMENTS

Systems and methods according to one or more embodiments of the invention provide elegant, efficient, and cost effective options for monitoring the operating condition of mechanical components of fuel farms or if desired other electromechanical systems having motors or rotating components. By monitoring mechanical operation of components such as motors and their environment, systems and methods can allow a human operator to make early decisions to determine whether to perform diagnostics or conduct physical inspection of components. The systems and methods combine different features to provide modules and monitoring systems that outperform prior art systems such as by being power efficient, being cost effective, having a low profile, and having other performance characteristics. Existing known systems do not provide combinations of benefits and performance illustratively described herein.

Figure 1:
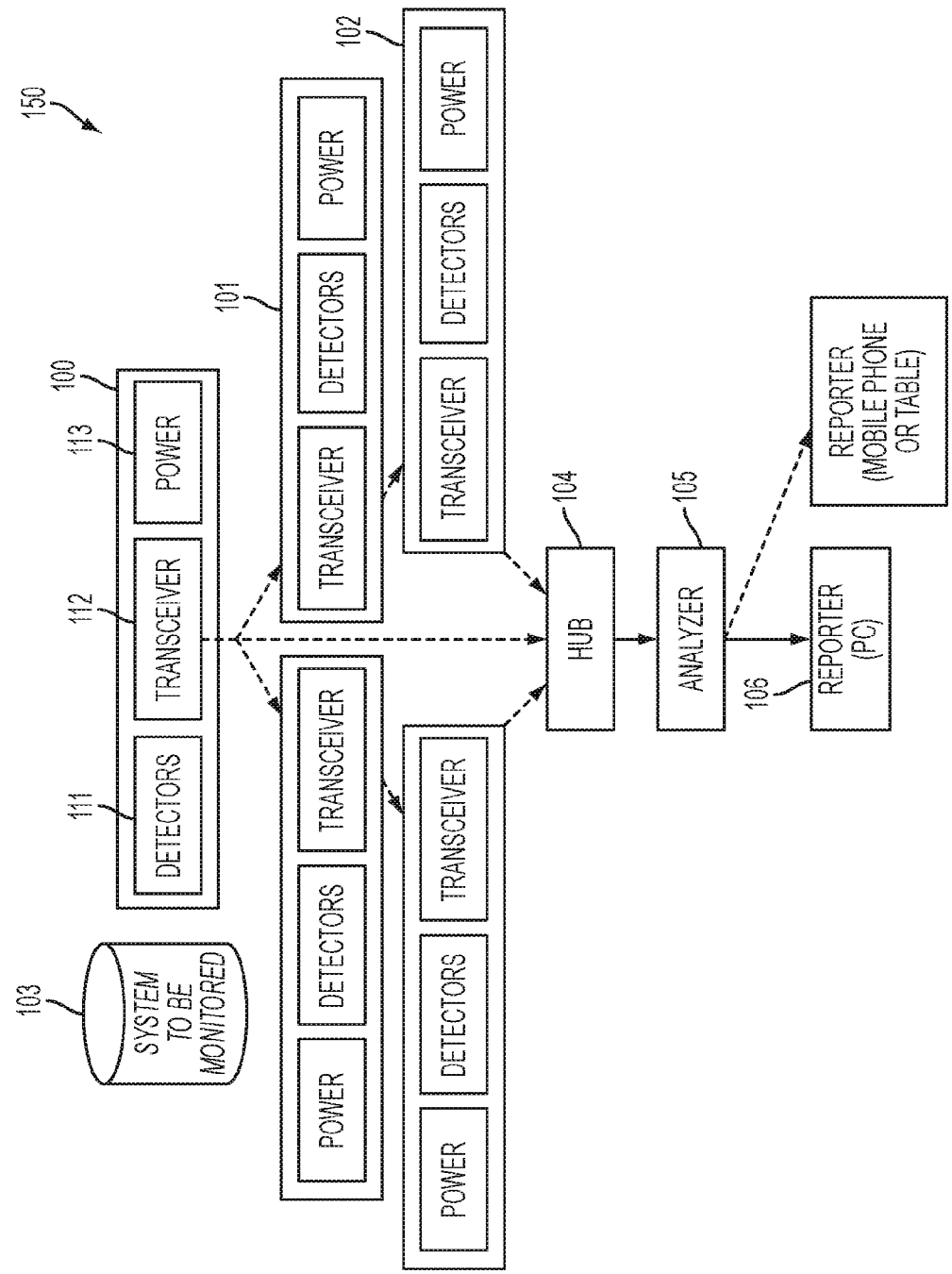
FIG. 1 illustrates one embodiment of the monitoring system.

Referring to FIG. 1, one embodiment of the monitoring system for monitoring a motor assembly is illustrated. Monitoring system 150 may comprise a plurality of modules 100, 101, 102, a motor assembly to be monitored 103, a hub computer 104, an analyzer computer 105, and a reporter 106.

Module 100 is adapted to be mounted to the motor assembly to be monitored 103, either to the frame of motor assembly 103 or to the motor assembly 103 itself, to acquire data generated by motor assembly 103. Multiple modules 100 may be employed to simultaneously monitor multiple different motor assemblies. The data generated may be in the form of temperature, vibration, current, voltage, sound, or combination thereof. In one example, module 100 may be configured to sense temperatures and vibrations generated by motor assembly 103. The sensed temperatures and vibrations, and those other temperatures mentioned below, may be expressed as either real numbers or absolute values for analysis. Module 100 may also have different data acquisition intervals and different data acquisition durations that can be selected depending on the desired measurements. For instance, module 100 may be configured to have a one hour interval and one second duration so that module 100 acquires the temperature and vibration data every hour over a one second period. Other intervals and durations are also available depending on the motor assembly's operating condition and the user's need. A motor assembly prone to electrical or mechanical problems may be monitored more frequently.

Modules 101 and 102 are utilized in conjunction with module 100 (or with each module 100 if there is more than one module 100) to assist the determination of the operating condition of motor assembly 103 and to relay the data acquired to hub computer 104. The relay is earned out through the transceivers of modules 100, 101, 102. Either or both modules 101 and 102 may also be configured to sense the environment temperature of the location in which motor assembly 103 is installed. The sensed environment temperature is useful in determining the temperature of motor assembly 103 at a specific time and the temperature change of motor assembly 103 influenced by the environment temperature in a given period of time. Since sensing the environment temperature requires a measurement without the influence from the heat generated by motor assembly 103, modules 101 and 102 are preferably positioned not on motor assembly 103 and at a location distant from motor assembly 103. Although only two modules 101 and 102 are shown, modules more than or less than two can be implemented with monitoring system 150 depending on the distance between module 100 and hub computer 104. When module 100 is in close proximity to hub computer 104, direct communication without utilizing modules 101 and 102 is preferred for faster transmission, either through wireless or wired connection. When module 100 is remote from hub computer 104, indirect communication relaying through modules 101 and 102 is preferred. As such, the communication between module 100 and hub computer 104 can be extended and wireless connection is favored.

Motor assembly 103 may include, for example, motors, engines, fans, blowers, gearboxes, compressors, spindles, cooling towers, belts and chain drives, pumps and pumping stations, manufacturing and power plants, food and beverage packing machines, HVAC system equipment, automotive suspension testing equipment, bridge vibration testing equipment, shock and vibration testing equipment, crash testing equipment, and electro-dynamic shaker testing equipment.

Hub computer 104 may be an electronic device such as a computer configured to collect the temperature and vibration data from modules 100, 101, 102 and to send the collected data to analyzer computer 105 via a wireless network. Hub computer 104 may also communicate with modules 100, 101, 102 and analyzer computer 105 through wired connection. Hub computer 104 may be placed at a location remote from modules 100, 101, 102 and analyzer 105 or at the same location as analyzer computer 105 and be physically coupled to analyzer computer 105.

Analyzer computer 105 may comprise hardware and software designed to receive the data from hub computer 104 and process and analyze the data. The hardware and software may comprise software to determine the operating status of motor assembly 103. The software may be customized by the user to match the data generated by motor assembly 103 such as the temperature and vibration data in this embodiment. The software can be configured to provide the user with at least one threshold for each of the temperature and vibration data. Analyzer computer 105 compares each of the measured temperature and vibration data with each respective threshold. The thresholds may be entered directly into analyzer computer 105 in advance if they are known, such as the maximum tolerable temperature and vibration of motor assembly 103 provided by the industry or by the manual came with motor assembly 103. They can also be determined and set by premeasuring the temperatures and vibrations of motor assembly 103 in normal operating condition over a period of time, averaging the premeasured data, and multiplying the averaged data by the appropriate number that constitutes a critical condition.

When the measured data is above the threshold, analyzer computer 105 would generate an alert to inform the user of a potential motor assembly problem or failure. In one example, the algorithms may utilize a rolling average calculation each set of data to compare against the thresholds. In another example, the algorithms may utilize instantaneous peak values to compare against the thresholds. In yet another example, the algorithms may utilize the average of the instantaneous peak values to compare against the thresholds. In yet another example, the algorithms may utilize the difference between the temperature of the motor assembly and the environment temperature to compare against the thresholds. Analyzer computer 105 may store the received data and the processed and analyzed data in storage elements including RAM, ROM, disk drives, compact disks, and floppy disks and may further transmit those data to a third party supervisory control and data acquisition (SCADA) system.

Figure 2:
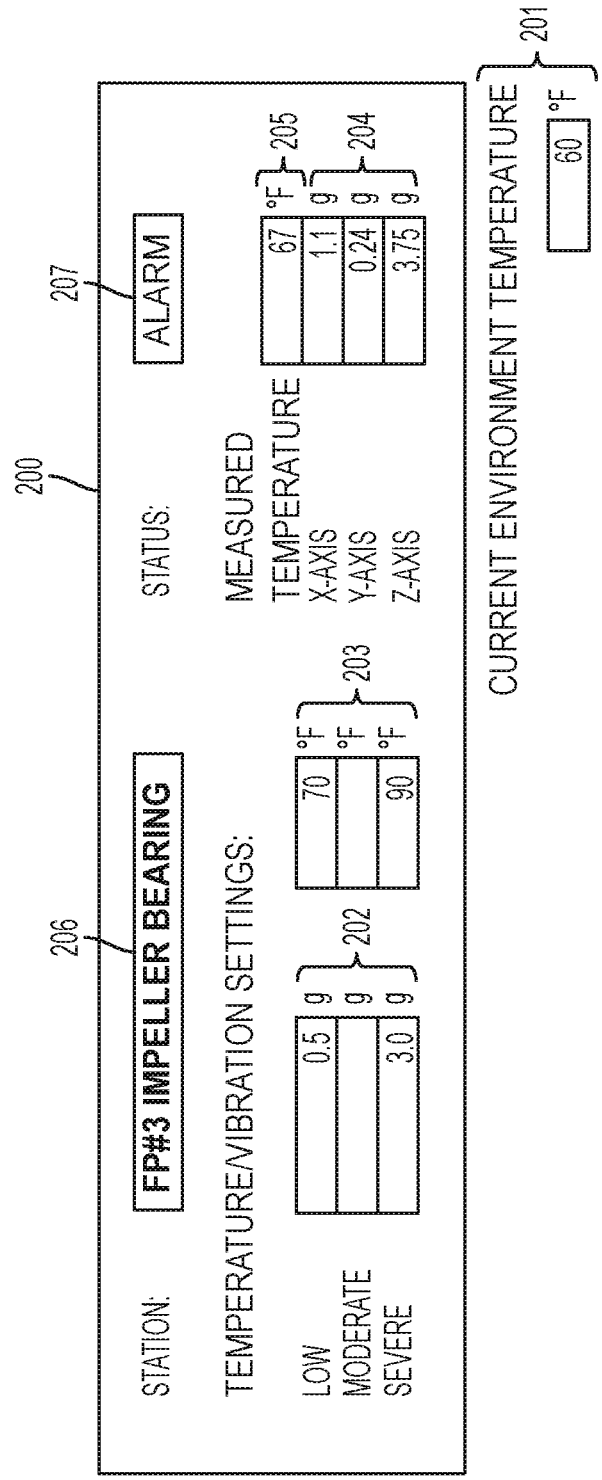
FIG. 2 illustrates the displayed information of the reporter.

Reporter 106 is an output device that displays information from analyzer computer 105 to the user. Referring to FIG. 2, the displayed information may include the current environment temperature 201, the vibration and temperature thresholds 202, 203, the measured vibrations in the three axes 204 and temperature 205, and the name 206 and status 207 of the motor assembly being monitored. The vibration and temperature thresholds 202, 203 may further have a low, moderate, and severe level with which the measured vibrations and temperature are compared to determine the operating condition of the motor assembly. If the measured vibration in one of the axes or temperature exceeds one of the levels, reporter 106 will update the status 207 by displaying the level that the measurement exceeds. When no measurement exceeds a threshold, the status 207 will display "NORMAL." For example, as shown in FIG. 2, the low, moderate, and severe temperature thresholds may be set by the user to be 70° F., 80° F., and 90° F., respectively, and the low, moderate, and severe vibration thresholds may be set to be 0.5 g, 1.5 g, and 3.0 g, respectively. Since the measured temperature 205 is 67° F. and does not exceed any of the temperature threshold levels, a status update is not required. However, since the measured vibration in the z-axis is 3.75 g and exceeds the severe vibration threshold level 3.0 g, reporter 106 will display "SEVERE" or "ALARM" in the status 207 and may further beep to catch the user's attention. Reporter 106 may be a cathode ray tube (CRT) based television, liquid crystal display, or any device capable of displaying information. Reporter 106 may be integrated with analyzer computer 105 to save space or can be separated from analyzer computer 105 if reporter 106 is large in size.

Figure 3:
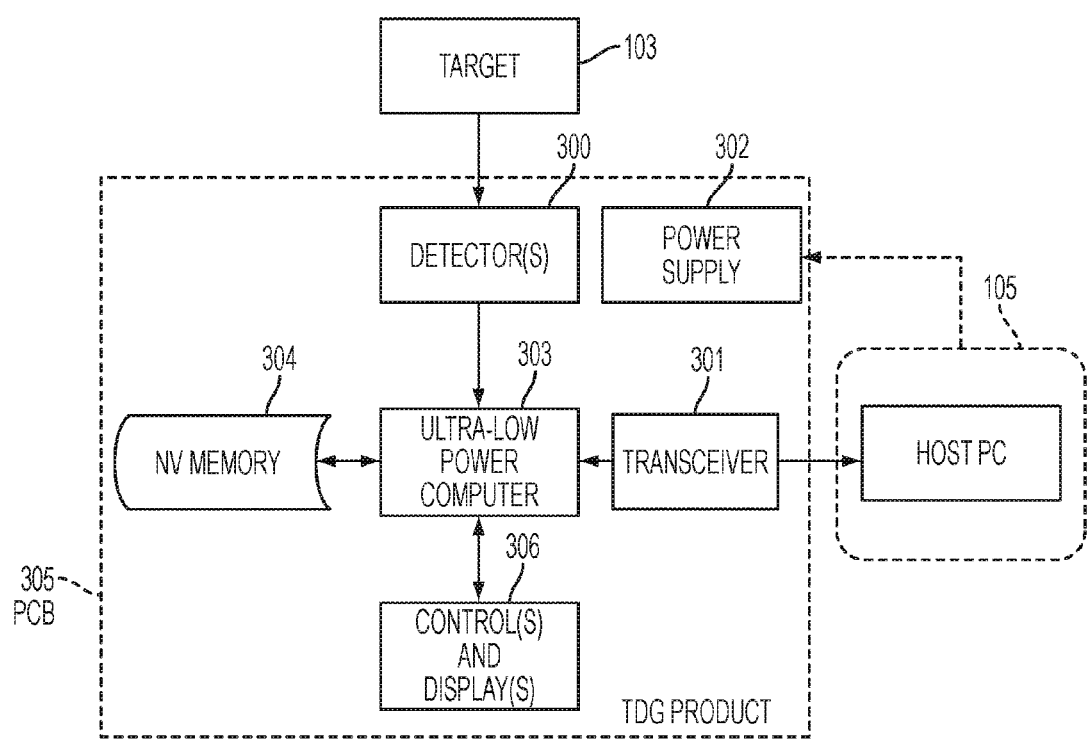
FIG. 3 illustrates the details of a module.

Referring to FIG. 3, the internal details of modules 100, 101, 102 are discussed. Each module 100, 101, 102 comprises detectors 300, a transceiver integrated circuit 301, a power supply 302, a microcontroller integrated circuit 303, a memory 304, and a printed circuit board (PCB) 305 on which detectors 300, transceiver integrated circuit 301, power supply 302, microcontroller integrated circuit 303, and memory 304 are mounted and electrically connected. Each module 100, 101, 102 may also contain controls and displays 306 that allow the user to manually and individually transmit the data acquired by and adjust the thresholds of each module 100, 101, 102 and to locally observe the data being sensed by modules 100, 101, 102 when the user is nearby the module(s). While the figure currently shows that transceiver integrated circuit 301 and microcontroller integrated circuit 303 are two separate components, they may be one single integrated component that has functions of both components in another embodiment.

Detectors 300 can comprise analog and digital electronics designed to detect, filter, analyze, and store the temperature and vibration data generated by motor assembly 103. Detectors 300, for example, may comprise a temperature sensor that measures the temperature of motor assembly 103, the environment temperature, and a die temperature and generates a signal corresponding to each temperature and a vibrations sensor that measures vibrations in the three axes of motor assembly 103 and generates a vibration signal corresponding to each measurement in the x, y and z axis. All the measured temperatures may be measured as the actual temperature sensed, such as 60° F., as the rate of temperature change, such as increasing or decreasing at 1° F. per second for a period of time, as an average of the actual temperature sensed in a period of time, or as an average of the rate of temperature change for multiple periods of time. These measurements may be stored in the internal registers of the temperature sensor that may be read by microcontroller integrated circuit 303. In module 100, the temperature sensor may be an infrared (IR) sensor that measures the motor assembly temperature. In modules 101, 102, the same sensor measures the environment temperature. The measured die temperature may be compared with the motor assembly temperature and the difference between the two temperatures may be a good indicator of the operating condition of motor assembly 103. Thus, different amounts of the difference may be set as thresholds as well to notify the user. The vibrations sensor may be a MEMS 3-D accelerometer configured to measure a vibration in the range of 0 to 16 g.

The microcontroller integrated circuit 303 and the modules 100, 101 and 102 can be implemented to include a particular process with respect to temperature monitoring. The microcontroller integrated circuit 303 may be first initialized to read a temperature from the temperature sensor, which is a base temperature, and to set the measurement interval for temperature acquisition by the temperature sensor. The initialization step may occur at the power on of the microcontroller integrated circuit 303 or any time when the microcontroller integrated circuit 303 resets the operation of the temperature sensor. The measurement interval may be every 100 ms, every 3 seconds, or at any other interval set by the user. If desired, the temperature sensor can be programmed to perform temperature acquisition at the measurement interval rate before it is installed or at installation such that it does not depend on the microcontroller for specifying the interval rate. In a preferred embodiment, the measurement interval is every 3 seconds. After the initialization step, the microcontroller integrated circuit 303 goes into "sleep" indefinitely by turning itself off or by turning sections of the microcontroller integrated circuit 300 off, and the temperature sensor measures a temperature at the user-set interval, such as every 3 seconds, to obtain the most recent base temperature. The microcontroller integrated circuit 303 sleeps even when the temperature sensor is measuring the temperature. Those of ordinary skill in the art will understand the meaning of a sleep state such as in devices that have multiple operating states such as three state design on, off, and sleep states. A sleep state can for example be one in which the device receives and applies power in order to only be able to receive and respond to interrupts (e.g., to maintain an operating state to a minimal amount for be able to handle a small subset of functionality until the device turns on (fully on)). In another embodiment, the microcontroller integrated circuit 303 may be configured to sleep only between each measurement and to be awakened when there is a measurement. For instance, using the above example, the microcontroller integrated circuit 303 sleeps for 3 seconds and is awakened every 3 seconds.

As shown, the temperature sensor is an integrated circuit, "a chip," that is formed from semiconductor material and installed on a PCB. Detectors or others sensors are also implemented using integrated circuits. Preferably, the temperature sensor and vibration sensor are separate semiconductor chips. The microcontroller integrated circuit is a separate chip.

With respect to the operative process for monitoring temperature, after each measurement by the temperature sensor, the temperature sensor has the circuitry and/or software configured internally that compares the measured temperature with a maximum tolerable temperature. The maximum tolerable temperature may be a factory specified operational threshold for the monitored equipment, but is preferably a "rise target," which is the sum of the base temperature (measured and provided to the microcontroller IC when the device was turned on or reset) and a user-supplied time interval times a user-supplied slope. The "rise target," for example, is 27° C. When the base temperature is 25° C. and the user selects 1 minute for the time interval and 2° C./minute for the slope. The "rise target" is also the maximum allowed temperature of the user-supplied time interval or the 1 minute interval based on the above example. The factory specified operational threshold and/or the "rise target" are stored in the memory of the temperature sensor as "MaxTemp." if desired, it can be stored in a register that is part of the temperature sensor or in other parts of the temperature sensor as long as it is accessible to the temperature sensor.

When the comparison shows in the temperature sensors finds that the measured temperature is greater than the maximum tolerable temperature or the "rise target," the temperature sensor interrupts or awakens the microcontroller integrated circuit 303. The interruption causes the microcontroller integrated circuit 303 to request a temperature read from the temperature sensor, which is the temperature exceeding the maximum tolerable temperature, and to send the read temperature and an alarm via a wireless network technology to the user hub computer 104, analyzer 105, or reporter 106.

When "rise target" is used as the maximum tolerable temperature, the microcontroller integrated circuit 303 may perform a comparison as follow. The microcontroller integrated circuit 303 compares the difference in time since it last set the MaxTemp value or to a value of 1 minute based on the above example. This value represents the time the temperature has to remain below the MaxTemp value to be considered as less than Maximum Temperature Rise Rate. Thus, if the elapse time was less than a minute, then the microcontroller integrated circuit 303 knows that the temperature rise rate has exceeded the limit and it processes to send an alarm to the host computer via the wireless network. If, however, the elapsed time is greater than a minute, then the temperature rise rate has not exceeded the limit, the microcontroller recalculates the MaxTemp value (using the currently measured temperature), resets the temperature sensor, and goes to sleep again. In other words, the temperature rise check is performed after the microcontroller integrated circuit 303 is interrupted by the temperature sensor and only the elapse time is used to determine if Max Temp Rise Rate has been exceeded.

Accordingly, while the microcontroller integrated circuit 303 immediately captures temperature increase after it is interrupted, the rate is not being continuously calculated and checked by either the temperature sensor or the microcontroller integrated circuit 303. This is an expedient method of guarding against temperature rises while minimizing the amount of power the microcontroller integrated circuit 303 and the temperature sensor use.

Temperature sensor and microcontroller integrated circuit collaborating in such a manner provides an improved monitoring system and process. Temperature sensor and microcontroller integrated circuit having the above configurations can prolong the life-time of battery while continuously checking if the being monitored equipment is operating normally (e.g., the temperature is not spiking). The above configurations can also check if there is accelerated or rapid temperature increase because the temperature sensor can identify if the current temperature (the based temperature measured by the temperature sensor) is above a temperature value representative of temperature rate increase above a pre-specified threshold ("rise target").

While the microcontroller integrated circuit 303 is interrupted or awakened when the base temperature exceeds a maximum tolerable temperature, the microcontroller integrated circuit 303 may also be interrupted under other circumstances such as when it is instructed by an accelerometer (vibration exceeding a threshold), when it receives a request from a host computer or DUST network controller for data or information, or when there are other situations such as low battery, watchdog, console, etc. All these other interruptions can apply to the microcontroller integrated circuit 303 whether it is configured to sleep indefinitely or to sleep only between each measurement and to be awakened when there is a measurement. When the microcontroller integrated circuit 303 is interrupted by the temperature sensor or under one of those circumstances, the microcontroller integrated circuit 303 can request a new base temperature from the temperature sensor and will again calculate and store the MaxTemp value ("rise target") in the temperature sensor before putting itself to sleep again.

It is likely that in operation the device will be able to operate on battery power for long periods of time due its configuration described above. It is likely that interrupts or alarms requiring an interrupt will occur a very small percentage of the time. With this technique, the microcontroller can remain asleep (requiring little power) indefinitely—until an interrupt is triggered (a rare event) such as if the device is experiencing a sudden unexpected rise in temperature. The structure of the temperature sensor can also be very simple because it may only need to perform a comparison against a threshold temperature to determine whether to issue an interrupt. The microcontroller also has an efficient process because it simply only needs to compare the current time to the time the Max Temp was calculated for the temperature sensor to determine if the time interval is less than the time interval used in calculating the Max Temp.

All these measured temperatures and vibrations may be transmitted to hub computer 104 or analyzer computer 105 with or without filtering, analyzing, or conditioning by the sensors. These processing may include taking the Fourier Transform and derivative of the measurements and determining the number of signal peaks in a duration or interval. When the measurements are transmitted without processing, they may be subsequently processed at hub computer 104 or analyzer computer 105. In preferred embodiments, detectors 300 and microprocessor integrated circuit 303 are configured or adapted to sense temperature and vibration conditions and to transmit the sensed state (e.g., sensed temperature, sensed vibration measurement, etc.) to hub computer 104 or analyzer computer 105 without processing.

Transceiver integrated circuit 301 can be a wireless communications integrated circuit designed to implement a particular wireless network protocol (including combinations of low and high level protocols necessary for next hop or network level communications management), and can include an internal sensor (on-board the IC chip) designed to measure a die temperature of transceiver integrated circuit 301. This measured die temperature may be measured as the actual temperature sensed, as the rate of temperature change, as an average of the actual temperature sensed in a period of time, or as an average of the rate of temperature change for multiple periods of time similar to the temperature sensor of detectors 300. Transceiver integrated circuit 301 can include an on-board processor designed to process the information transceiver integrated circuit 301 receives and transmits. The wireless communications or transceiver integrated circuit handles wireless protocol interactions and lower level functions such as modulation and transmission. The wireless network protocol may be WiFi, Bluetooth, HART (e.g., wireless HART), DUST networks mesh network, and/or Zigbee. The protocol, frequency, and configuration of the wireless network protocol may be selected to optimize the throughput, range, and power requirements of modules 100, 101, 102 and monitoring system 150. Transceiver integrated circuit 301 may also be coupled to an antenna and utilized in conjunction with the wireless network protocol to achieve the optimization. Like the aforementioned temperature and vibrations measurements, this measured die temperature can also be either processed or unprocessed by transceiver integrated circuit 301 before transmitting to module 101, 102, hub computer 104, or analyzer computer 105. When processing is desired before transmitting, the measured die temperature is first sent to microcontroller integrated circuit 303 for processing. When no processing is wanted before transmitting, the measured die temperatures is transmitted directly to module 101, 102, hub computer, or analyzer computer 105. The unprocessed measured die temperature can then be subsequently processed by hub computer 104 or analyzer computer 105. Moreover, this die temperature may serve the same function as the die temperature of the temperature sensor of detectors 300 calculating the difference between the motor assembly temperature and this die temperature that may be used to compare against the thresholds of this difference. In preferred embodiments, the die temperature of the temperature sensor of detectors 300 is used for calculating the difference. However, in another embodiment, the die temperature of transceiver integrated circuit 301 may be used. Unprocessed data refers to the measured temperature or vibration level. Minimally processed data can also provide advantages such unprocessed data. For example, performing simple averaging, identification of peaks, or other simple processes that is low weight in calculation and complexity can have similar advantages and can be sent by the module over the network. Transceiver integrated circuit 301 should always be powered on to allow the measuring of the die temperature, and so as to handle transmission and reception of data between modules 100, 101, 102 and hub computer 104. Nevertheless, it may also be configured to not always be powered on and to measure only once in a while such as every 15 minutes.

Power supply 302 may be an internal power source such as a battery or if desired, an external power source such as an electrical outlet or USB connection. When the power supply is a battery, a battery holder may be employed to connect the battery to PCB 305.

Microcontroller integrated circuit 303 is configured to receive the temperature and vibration signals from the sensors of detectors 300 and a battery level signal, to process the received signals, and to transmit the processed signals to transceiver integrated circuit 301. One embodiment reflecting processing and packet communications structure of embodiments of the systems and components of the present invention is shown in FIG. 4.

Figure 4:
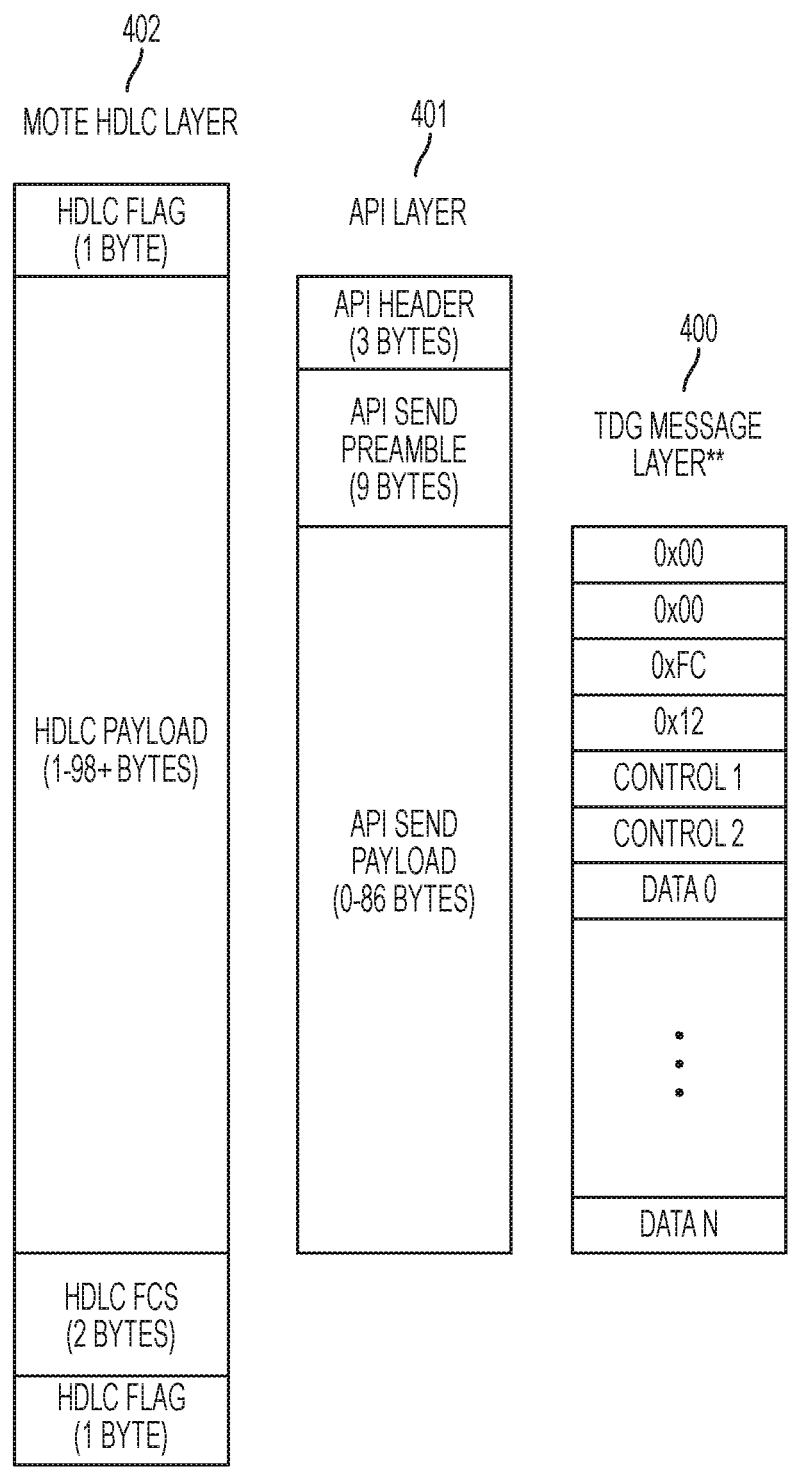
FIG. 4 illustrates one embodiment of the microcontroller integrated circuit and the transceiver integrated circuit generating a packet for each received signal before transmitting to another module or the hub computer.

Referring to FIG. 4, when microcontroller integrated circuit 303 receives the signals, microcontroller integrated circuit 303 generates a message packet using message layer 400 for carrying each temperature signal received, each vibration signal received, and the battery level signal received. The message packet is then encapsulated by microcontroller integrated circuit 303 with an application programming interface (API) data to form an API layer message packet 401. API layer message packet 401 is then further encapsulated by microcontroller integrated circuit 303 with high-level data link control (HDLC) information to form a HDLC layer message packet 402 that is subsequently sent to transceiver integrated circuit 301. The API and HDLC encapsulations provide the protocols necessary to transmit the temperature, vibration, and battery level signals from microcontroller integrated circuit 303 to transceiver integrated circuit 301.

After transceiver integrated circuit 301 receives the HDLC layer message packet, transceiver integrated circuit 301 un-encapsulates the HDLC information and replaces that information with the appropriate information or wireless protocol information associated with the transceiver integrated circuit. The resulting layers are then transmitted to modules 101 and 102 if hub computer 104 is remote from module 100 or to hub computer 104 if hub computer 104 is in close proximity.

In this arrangement, a packet based communications approach is used onboard the circuit of the module assembly. The processor and related circuitry (e.g., configuration programming or data), which is sometimes just referred to as the processor, generates packets that are in a format and protocol that is compatible with the protocol and structure used by the on-board transceiver circuit to receive data to be transmitted down-stream. The processor is configured to generate packets to contain a message that is compatible with the application running at the end device for using and viewing the data contained in the message.

Figure 5:
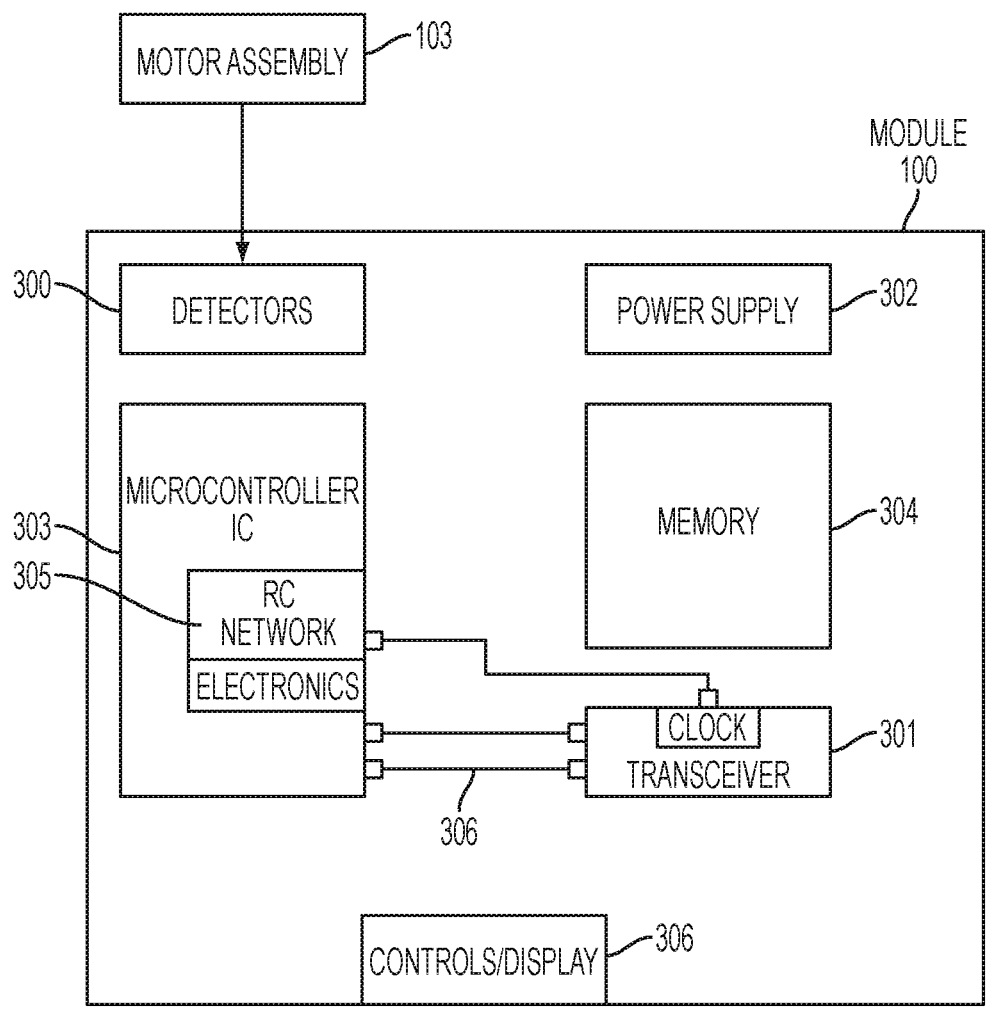
FIG. 5 illustrates one embodiment of a microcontroller integrated circuit having a RC network and adjusting the clock rate of the RC network to match clock rate of the transceiver integrated circuit.

Microcontroller integrated circuit 303 typically comes with a clock source such as crystal oscillator, ceramic resonator, integrated silicon oscillator, or RC network. In one embodiment, as shown in FIG. 5, a microcontroller integrated circuit containing an RC network 305 is used. An RC network is preferred because it is lower in cost and is also smaller in size. However, it is less reliable in maintaining a constant clock rate and as such, its clock pulses may not remain in sync with the clock pulses generated by the clock source of transceiver integrated circuit 301 after extensive periods of usage. Data (the above mentioned message packets) are transferred from microcontroller integrated circuit 303 to transceiver integrated circuit 301 using a serial connection 306. When the clock pulses of microcontroller integrated circuit 303 are out of sync with the clock pulses of transceiver integrated circuit 301, this may cause errors in the data transfer and communications between the circuits. To overcome this problem, microcontroller integrated circuit 303 is set up to self-adjust to match the clock pulses of transceiver integrated circuit 301. For example, when the clock pulses of microcontroller integrated circuit 303 are faster than the clock pulses of transceiver integrated circuit 301, microcontroller integrated circuit 303 would apply a correction to slow down the clock pulses of the RC network 305 and vice versa. The self-adjusting feature is implemented by configuring microcontroller integrated circuit 303 as a slave to the timing of transceiver integrated circuit 301 and by utilizing the internal registers of microcontroller integrated circuit 303 and a software provided to microcontroller integrated circuit 303.

Microcontroller integrated circuit 303 is also configured to reduce the power consumption of modules 100, 101, 102 and monitoring system 150. This may be achieved by turning off sections of microcontroller integrated circuit 303 for most of the time (sleep mode) and to automatically turn on those sections only at specified intervals (wake up mode) and only when a significant temperature event, a significant vibration event, or both are sensed to be an emergency by detectors 300 (wake up mode). For example, sections of microcontroller integrated circuit 303 may be configured to remain off, or sleep, normally and to turn on, or wake up, only every hour and only when either the measured vibration or temperature exceeds a certain threshold level. In another example, those sections of microcontroller integrated circuit 303 may be configured to turn on, or wake up, every 8 to 16 seconds to read the measured motor assembly temperature and the die temperature of the temperature sensor of detectors 300 and calculate their difference, to average all the differences in a one hour period after an hour, and to determine if the average exceeds a certain threshold level. In this second example, those sections of microcontroller integrated circuit 303 may also be further configured to turn on, or wake up, when either the measured temperature or vibration exceeds a certain threshold level outside the regular 8 to 16 seconds wake up period. As such, whether a problem occurs during the wake up mode or sleep mode, the user will always be notified.

Since electronics require sometime to transition from sleep mode and wake up mode to be active, the turning on process may be initiated at a few seconds, preferably less than 10 milliseconds, before the measurement or transmission time. Microcontroller integrated circuit 303 may further include turning off the sections mentioned above permanently until a new battery is inserted and transmitting only the (low) battery level signal while those sections are off. Microcontroller integrated circuit 301 having all these configurations renders a battery life of about an year. Microcontroller integrated circuit 301 may contain an internal RAM to store information retrieved from memory 304 without repeatedly requesting the same information when needed.

Memory 304 may be a non-volatile memory such as electrically erasable programmable read-only memory (EEPROM) that can store information even when modules 100, 101, 102 are not powered. The information stored may include parameters that are configured for the operation of modules 100, 101, 102 such as acquisition rate, units of measurement for temperature, which may include Celsius or Fahrenheit, units of measurement for vibration, which may include g or m/s", and temperature and vibrations thresholds. These parameters are accessible and retrievable by microcontroller integrated circuit 303 for the operation of modules 100, 101, 102 once modules 100, 101, 102 are powered by power supply 302.

Due to potential noise and electromagnetic interference from the electronics in modules 100, 101, 102, motor assembly 103, and the environment in which the motor assembly 103 is installed, these parameters sometimes may be corrupted in two situations. In the first situation, the parameters may be corrupted when they are transferred from memory 304 to microcontroller integrated circuit 303. In the second situation, the parameters may be corrupted after storing the transferred parameters in the internal RAM of microcontroller integrated circuit 303 after a long period of time. Thus, it is desired to check the parameters if they are accurate in these situations.

Figure 6A:
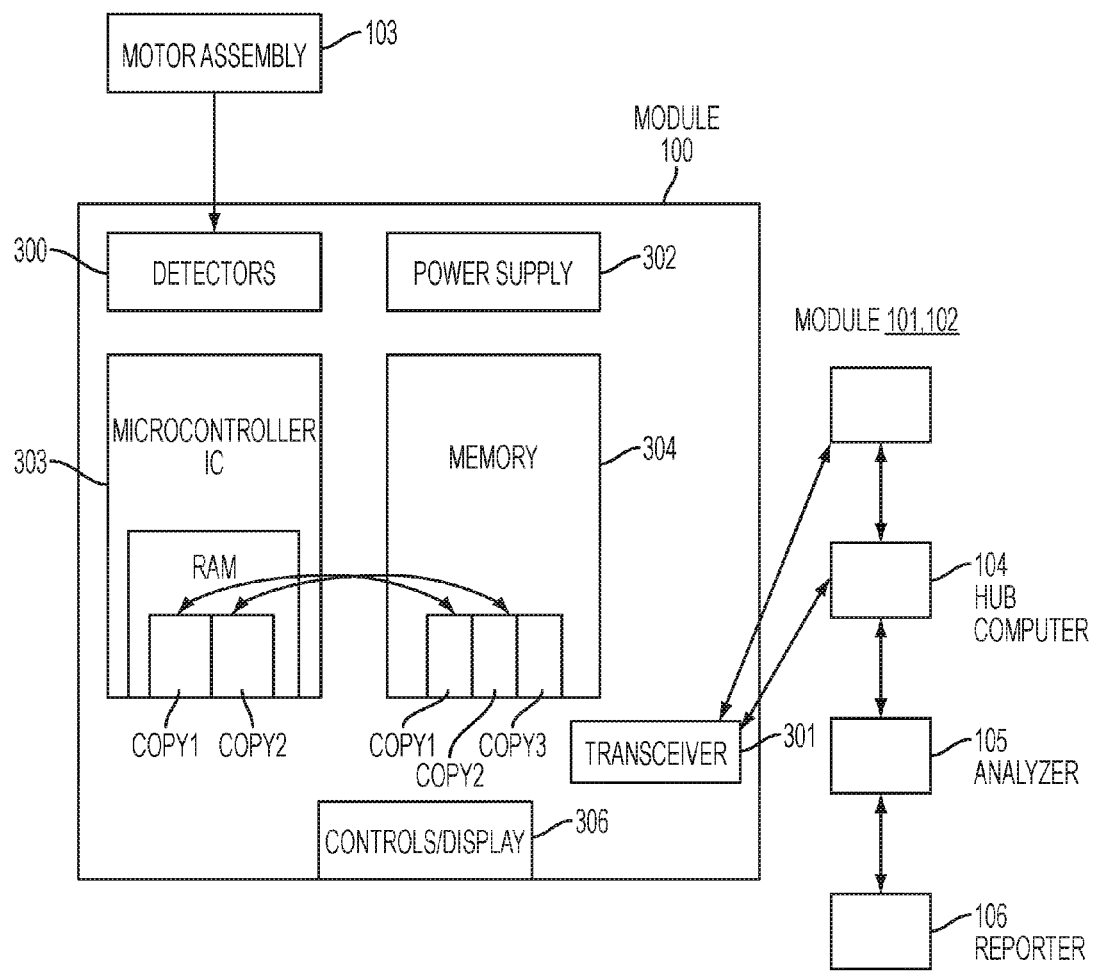
FIGS. 6(a) and 6(b) are a physical representation of how the parameters are generated, transferred, stored in a module and a method for checking corruption, respectively.
Figure 6B:
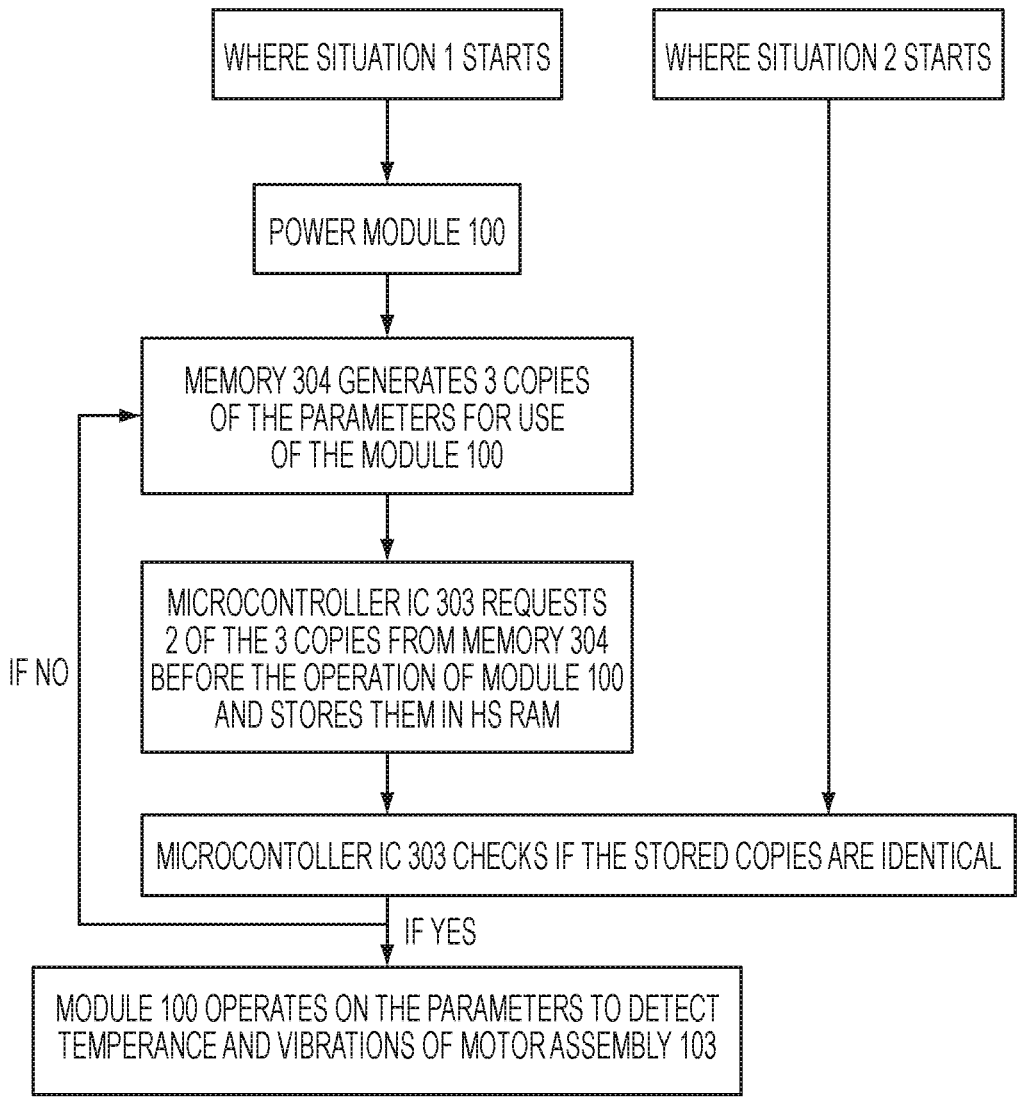

FIG. 6(*a*) is a physical representation of how the parameters are generated, transferred, and stored in module 100 and FIG. 6(*b*) illustrates a method for checking corruption. To check corruption in the first situation, memory 304 may initially make three copies of the parameters (or data block)

and microcontroller integrated circuit 303 may then request all of the three copies, check if all of the three copies are equal by using a bit-by-bit comparison, and store two of those three copies in its RAM if all of the three copies are equal. The stored two copies will then be used in the operation of modules 100, 101, 102. If the check reveals that all of the three copies are not equal, microcontroller integrated circuit 303 would operate to communicate with memory 304 to either resend the three copies or regenerate another three copies of the same parameters and send the regenerated copies to microcontroller integrated circuit 303. If the transfer is not interfered by noise or electromagnetic interference, microcontroller integrated circuit 303 now has the correct parameters for the operation of modules 100, 101, 102 and the modules 100, 101, 102 will be set to function based on those parameters. If the transfer is again interfered, this process may be repeated until the correct parameters are received by microcontroller integrated circuit 303. In the second situation, the steps above are essentially the same except that the check does not occur until the stored two copies are about to be used by the microcontroller integrated circuit 303. When the microcontroller integrated circuit processes an operation that requires retrieving a preconfigured data parameter, the microcontroller will perform a bit by bit comparison between the two copies in the RAM to determine whether they are the same and if they are not, it will perform a process in which two new copies are generated and transferred to the RAM to replace the defective data or data block. As part of this process, the microcontroller integrated circuit may also conduct one or bit by bit comparison of the data in ROM to check if they source data on-board the device is still accurate. This improves the accuracy and efficiency of the device. The bit-by-bit comparison has the advantages of saving clock cycle and energy compared to checksum algorithm that adds all the bits together and determines if the sum is 1 or 0.

Figure 7:
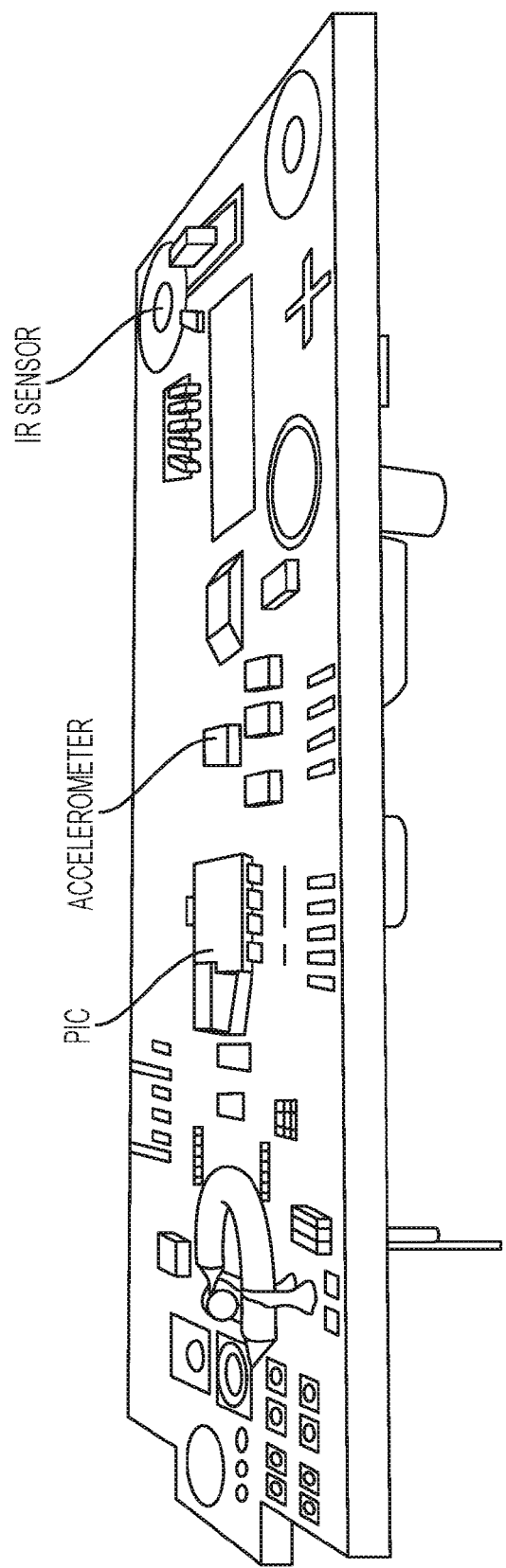
FIGS. 7 and 8 illustrate one embodiment of the printed circuit board.
Figure 8:
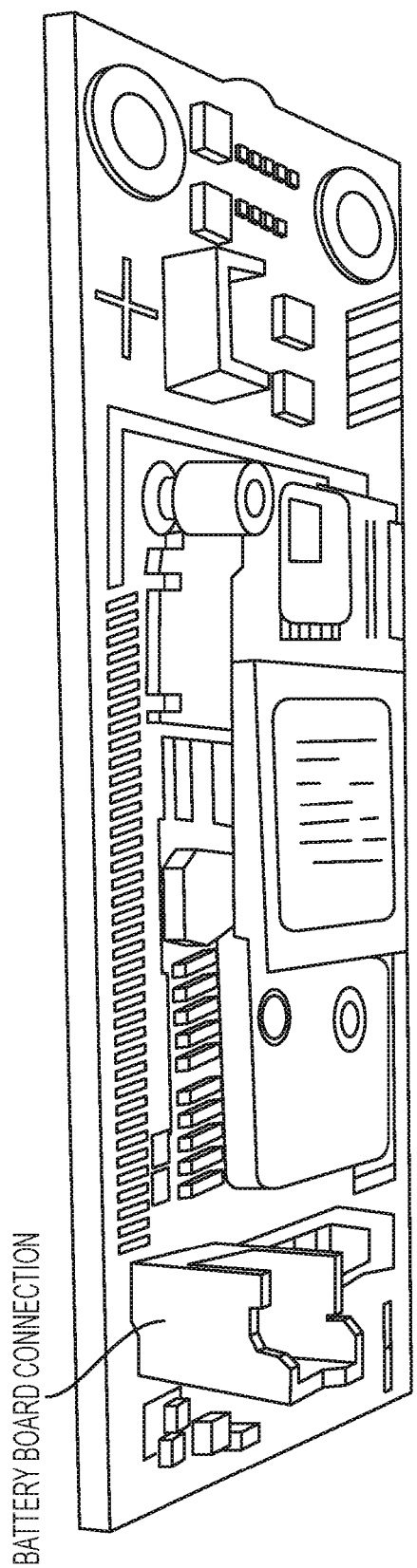

Referring to FIGS. 7 and 8, one embodiment of PCB 305 is illustrated. PCB 305 comprises four layers: a top layer, a bottom layer, a power layer (not shown), and a ground layer (not shown). The power and ground layers are sandwiched by the top and bottom layer. PCB 305 has circuitry on both the top and bottom layer for electrically connecting all the electronics thereon to each other. The temperature and vibrations sensors may be placed on the bottom layer as shown in FIG. 7, and the battery and battery holder, if an internal power source is utilized, may be placed on the top layer shown in FIG. 8. In this way, larger and more sophisticated temperature and vibration sensors and a larger capacity battery may be utilized without physically interfering with each other and yet still have a module that is compact in size. The battery and battery holder may also be placed directly over some of the integrated circuits on the top layer to reduce their footprints on PCB 305 so that the module size can be further reduced. When module 100 is mounted on motor assembly 103, the bottom layer with the sensors faces toward motor assembly 103 to measure temperatures and vibrations. Detectors 300, the transceiver integrated circuit 301, power supply 302, microcontroller integrated circuit 303, memory 304, and PCB 305 all are housed in an enclosure 900.

Figure 9:
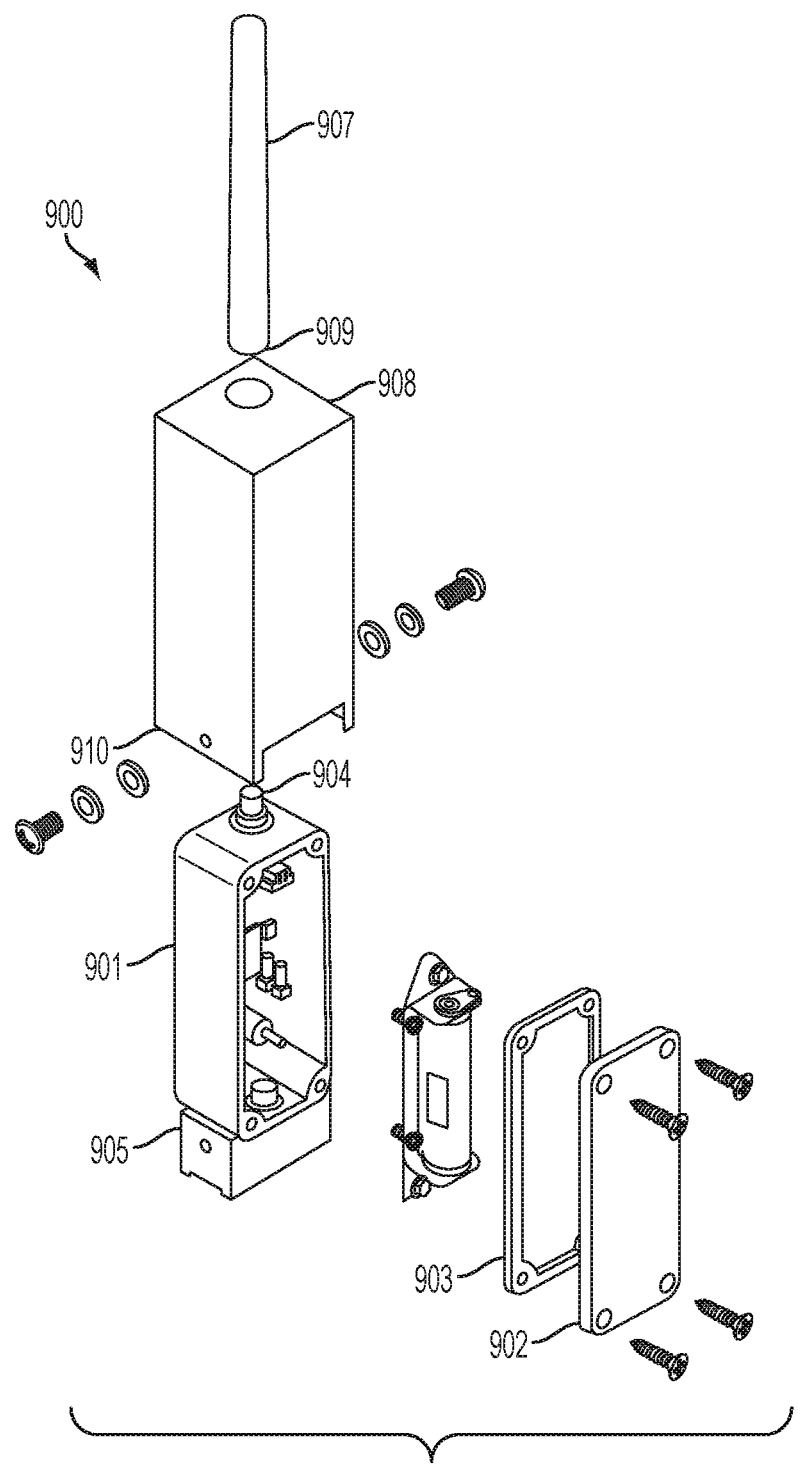
FIG. 9 illustrates one embodiment of the enclosure.

Referring to FIG. 9, one embodiment of the enclosure 900 is illustrated. The enclosure 900 may comprise a base 901 having a first end and a second end, a lid 902 covering the base 901, a gasket 903 placed between the base 901 and the lid 902, an antenna mount 904 connected to the first end, an adapter 905 connected to the second end, and a shield 908 covering the base 901, the lid 902, and the gasket 903, wherein the shield 908 has a first hole 909 through which the antenna mount 904 penetrates to connect to an antenna 907 and a second hole 910 through which mounting hardware such as screws and washers may be inserted to fix the shield 908 to the adapter 905.

The base 901 should have an internal volume with sufficient depth to house detectors 300, transceiver integrated circuit 301, power supply 302, microcontroller integrated circuit 303, memory 304, and PCB 305. When power supply 302 is a battery, the battery along with the battery holder may be mounted in the base 901 lengthwise.

The shield 908 is made of a material that is capable of withstanding extreme weather and various harsh industrial environments to protect the electronics in the module. The shield 908 may be solar proof, windproof, waterproof, heatproof, or any combination thereof. However, the shield 908 is optional and may or may not be required depending on where modules 100, 101, 102 and motor assembly 103 are installed, either indoors or outdoors, and the harshness of the environment in which motor assembly 103 is installed. For example, modules 100, 101, 102 generally may not require the shield 908 if they are used indoors and may require such shield only if used outdoors or if used indoors and the indoor environment is harsh due to the operational nature of motor assembly 103. The shield 908 can minimize influence from these areas on the measurements. In a preferred embodiment, the enclosure has an environmental protection rating of IP66.

The adapter 905 provides structures that can physically connect the modules to the frame of the motor assembly 103, the motor assembly 103 itself, or places where modules 100, 101, 102 are desired. The adapter 905 also has a means, material, or structure that allows the temperature and vibrations sensors in the base 901 to perform and receive measurements from motor assembly 103.

An enclosure with the above arrangement and assembly provides a module that is compact in size and that can withstand severe weather and industrial environments. Such enclosure provides low profile module that preferably has a length in the range of 8-9 inches, a width in the range of 1-2 inches, and a depth in the range of 1-2 inches. Each module having such enclosure weighs approximately 7.3 oz. Preferably, the module is configured to have an operating temperature of approximately −40° C. to ±80° C. This is implemented by way of using components that meet those performance capability and the arrangement and configuration of the module and components, as show, to achieve such characteristics. Thermal and vibrational monitoring may preferably have a rigid enclosure whereas voltage and current monitoring may preferably have electrically conductive or inductive connections. Moreover, the enclosure preferably does not, in any way, hinder the sensing, receiving, and transmitting of the temperature and vibrations data.

The enclosure may further contain colored LED lights to indicate acceleration and heat intensity. For example, green, yellow, and red light may indicate low, medium, and high acceleration and/or heat intensity, respectively.

The module may be configured using two internal temperatures sensors (e.g., die sensor and IR sensor measuring associated device temp) to compare and determine a slope of the temperature over a short period of time. A sudden peak in the slope can signify an alarm condition and be communicated from the module or can be identified by the analyzer computer or other computer by performing the comparison or readying the slope (e.g., if the system transmits the slope).

The sudden peak can be configured on the module as an emergency alert that prompts transmission out of cycle or scheduling timing.

In some embodiments, a power sensor feature can be integrated into the system with the temperature and vibration sensors. The integration of the power sensor can improve the operational performance of the monitored system. The feature is directed to associating sensed vibration information with the variable frequency power signal applied to an individual motor or pump. Each or substantially all of the motors in the system under monitoring can be monitored with respect to their power signal and its association with its corresponding vibration data sensed by the monitoring system. In some embodiments, the monitoring system is configured to monitor the variable power signal and associated vibration data and in response, automatically set the power signal (e.g., frequency of the alternating current signal) for a motor or each individual motor to receive a power signal that corresponds to the operational state for that specific and actual motor (reflecting the design or wear of the motor over the years) which minimizes vibrations, minimizes low frequency vibration for that motor, or achieves some other desired performance characteristic. The feature can be implemented as a separate and distinct module, separate from the temperature and vibration modules As discussed above, the new feature can be integrated into the above design and incorporated into the system as an additional sensor component that uses the above-described approach (e.g., for wireless communications, data communications, device housing, etc.). Additional sensors are added that will sense the electrical signal supplied to individual motors (which measure the frequency of the current driver). The signal can be indicative of the speed of operation of the corresponding motor. The sensed electrical signal information is associated by the vibration monitoring system with the sensed vibration data that is received from the vibration sensors. The data is displayed to the user at a hub or diagnostic computer that receives the data wirelessly from the sensors or from a hub that wirelessly receives the data. The electrical signal sensors is remotely located such as close to the motors. The maintenance personnel can preferably see the vibration effect of the electrical signal (e.g., different speed signals—as sensed) by viewing vibration data (e.g. graphs) in correspondence with the speed signal.

The sensed frequencies of drive current result in showing the frequency or frequencies corresponding to the least amount of vibrations. The drive current can be automatically or manually varied and in response, the monitoring system will sense, receive, store and/or display the response vibration data (from the above describe sensors). Resonant frequencies can be avoided using the system such as by implementing a processor and software that automatically avoids the resonant frequencies. Other configuration or application are also contemplated. For example, there may be some drive current frequencies that minimize low frequency vibration, while leaving high frequencies harmonics. The decision about what constitutes a "good" or "bad" vibration can configured to be a decision for the maintenance/engineering crew to manually assess or automatically monitor and identify. The sensed power signal information can be collected and displayed in a display on a screen.

Figure 10:
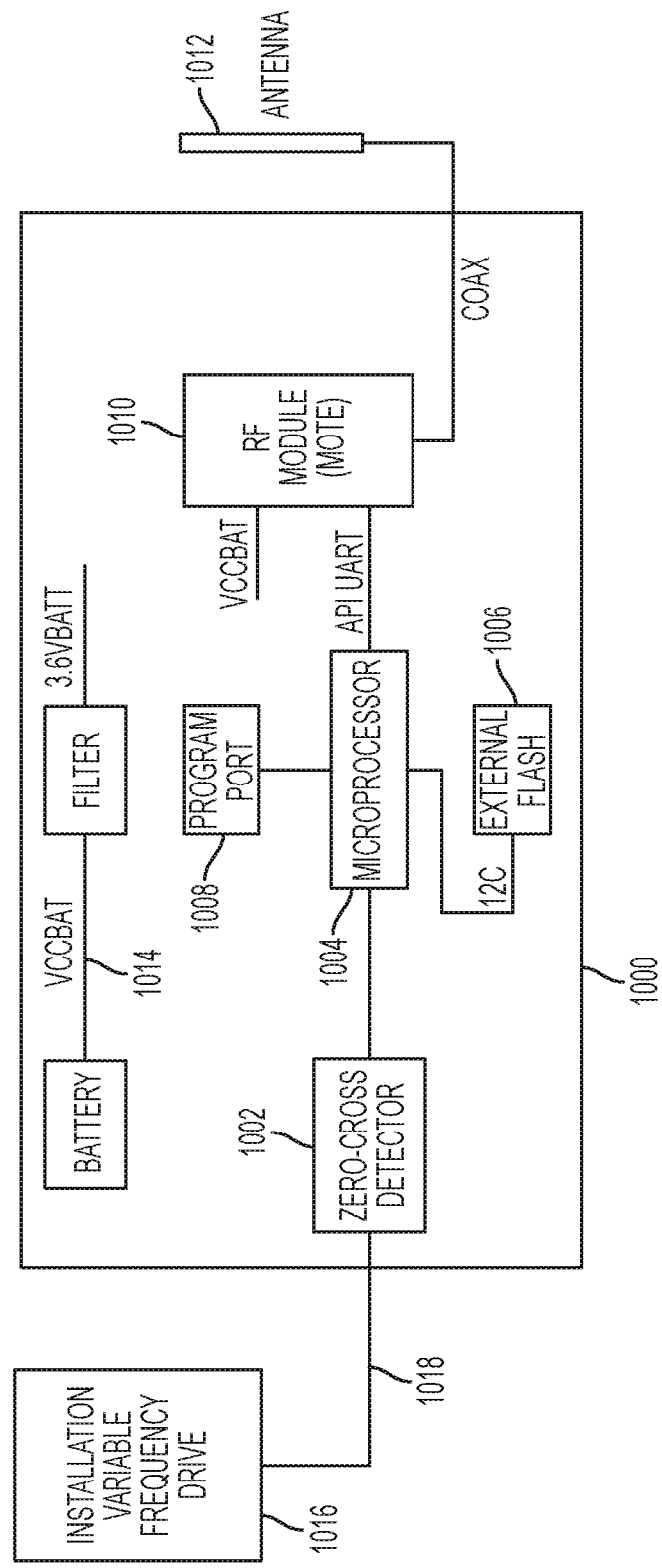
FIG. 10 illustrates an embodiment related to variable frequency feedback.

The sensor measures the frequency of the current driver. For example, with reference to FIG. 10, a sensor and monitoring module 1000 is provided that is configured to sense and measure the frequency of a current drive. Module 1000 can include zero-cross detector 1002, microcontroller (microprocessor) 1004, external flash connection 1006, programming port 1008, RF module 1010, antenna 1012, and power supply components 1014. Module 1000 receives a current drive signal (which is the signal used to drive one of the motors) from variable frequency drive 1016.

In operation, module 1000 includes an attachment mechanism that physically attaches to a structure at a physical point for monitoring the current driver. Module 1000 receives the variable frequency drive on line 1018. In this embodiment, the power signal is a variable frequency drive that is a three phase power signal. Module 1000 monitors any two of the three phases of the variable frequency drive. These two signals, which, in some implementations are approximately 440V, are sent into module 1000 through a chain of resistors (if desired, the resistors are positioned within the housing of module 1000). The resistor chain produces a current that is applied to zero-cross detector 1002. The zero-cross detector 1002 includes an optocoupler that includes LED, which is supplied the current. The output of the optocoupler is a rectangular pulse that is generated in response to the received current signal. Microcontroller 1004 measures the time period from leading edge to leading edge. This time period is wirelessly reported onto the DUST network using RF module 1010 and antenna 1012. This data is collected at the main control PC and adds frequency values to the vibration and temperature values already being logged by the monitoring system which is connected to the machinery being driven by the variable frequency drive (being sensed and monitored). The data can be received at the hub computer, analyzer, and/or reporter. The system can, if desired, automatically correlate vibration to frequency and can determine if there are mechanical resonances in this machinery that should be avoided when the setting for the variable frequency derive is set for operation. The sense frequency (measure based on leading edge to leading edge measurement) can be displayed on a receiving computer. Module 1000 can use the same components, hardware and/or software, that are describe herein for the vibration module that implements communications capability with other modules or hub computer.

The monitoring system can, therefore, include a power sensor module that receives a current signal representative of a variable drive frequency that is applied to a motor assembly and is configured to sense a frequency of the variable drive frequency by detecting zero crossing events in the current signal and wirelessly transmit the sensed frequency. The transmission and module can be in the same network as the other modules and the system receives the sensed frequency and vibration signals (e.g., at hub or other central point) as feedback and in response to the feedback, modifies the variable drive frequency to a set a drive frequency that improves an operational state of the corresponding motor (e.g., reduces vibrations, avoid certain vibration frequency such as low frequency, or other operational vibrating characteristic). Other techniques for detecting the frequency are also contemplated.

A variable frequency drive is an AC power source whose output frequency can be varied, depending on the load being driven.

Those of ordinary skill in the art will understood from the present description that the systems and in particular the modules and hub are for implementation in a local area for a particular operation of a facility. The modules are preferably part of the same wireless local area network in the geographic area of the facility.

With the aforementioned configurations and features, a highly efficient, accurate, low profile, and low power monitoring system can be materialized. Moreover, since the present monitoring system focuses mainly on providing monitored results to the user and alerting the user of certain operating status conditions, it can minimize on-board electronics, processing, and complexity to achieve those functions while also using a complex low powered networking protocol. As a result, the present monitoring system is much simpler in design and structures compared to other monitoring systems currently in the market that employ complicated electronics and algorithms to execute complicated functions such as storing historical health information, performing diagnostics, and predicting when failure is likely to happen. These complicated electronics, algorithms, and functions increase error rate, enlarge system size, and increase power consumption.

Computers or processors described herein are configured for operation to provide functions or an application by having an associated non-transient memory (e.g., ROM, hard drive, etc.) that contain computer-executable code that together with the computer and processor implements the functions or applications on the computer or processor (and circuitry). It should be understood that a computer or processor can include one or more computers or processors. Steps or elements of processes described herein can be or be implemented using computer-executable instructions that are earned out by a computer or processor. Steps or process elements can include additional or fewer steps and could be carried in different order as would be generally understood by those of ordinary skill in the art.

While particular embodiments of the present invention have been illustrated and described, it will be understood that various changes, additions, and modifications can be made without departing from the spirit and scope of the present disclosure. Accordingly, no limitation should be imposed on the scope of the present invention, except as set forth in the accompanying claims.

Accordingly all suitable modifications and equivalents may be resorted to falling within the scope of the invention. Unless defined otherwise, all technical and scientific terms used herein have same meaning as commonly understood by the person of ordinary skill in the art to which this invention belongs. As used herein and in the appended claims, the singular form "a", "and", and "the" include plural referents unless the context dearly dictates otherwise. All technical and scientific terms used herein have the same meaning. Thus the scope of the embodiments of the present invention should be determined by the appended claims and their legal equivalents rather than by the Figures.

What is claimed is:

1. A monitoring system for monitoring a group of motor assemblies in a closed geographic area to determine an operating condition of the motor assemblies, comprising:
   a plurality of modules that are adapted to be mounted to a motor assembly to sense vibrations generated by the motor assembly and sense temperature in close proximity to the motor assembly, wherein each module comprises: a shield, an enclosure,
   a plurality of detectors including a temperature sensor and a vibrations sensor, the plurality of detectors generate detector signals;
   a microcontroller integrated circuit that is configured:
   to receive the detector signals and transmit the detector signals to external points, and is also configured:
   to perform power control operations by turning off sections of the microcontroller integrated circuit over periodic durations to save battery life,
   to automatically turn on the sections of the microcontroller integrated circuit when a significant event is determined to be an emergency by the microcontroller integrated circuit, the significant event is determined from the received detector signals;
   wherein the microcontroller integrated circuit contains a RC network clock source that generates clock pulses and is set up to self-adjust to match the clock pulses of the RC network to clock pulses of the transceiver integrated circuit;
   a transceiver integrated circuit that implements a wireless mesh network protocol and is configured to receive and transmit the detector signals, a battery holder and a battery, and a printed circuit board,
   a hub computer configured to collect the detector signals via the network protocol from the modules and send the collected detector signals;
   an analyzer computer configured to receive the collected detector signals from the hub computer and process the collected detector signals by determining whether a threshold is reached and generating an alert when the detector signal at any one of the modules is above the threshold.

2. The monitoring system according to claim 1, wherein the wireless mesh network protocol is DUST mesh network.

3. The monitoring system according to claim 1, wherein the set-up comprises configuring the microcontroller integrated circuit as a slave to the timing of the transceiver integrated circuit and utilizing the internal registers of the microcontroller integrated circuit and a software provided to the microcontroller integrated circuit.

4. The monitoring system according to claim 1, further comprises a memory that stores parameters set for the operation of the modules.

5. The monitoring system according to claim 4, wherein the parameters comprise an acquisition rate, units of measurement for temperature, units of measurement for vibration, and temperature and vibrations thresholds.

6. The monitoring system according to claim 5, wherein the parameters are transferred to the microcontroller integrated circuit.

7. The monitoring system according to claim 6, wherein the parameters are checked for corruption after the transfer.

8. The monitoring system according to claim 7, wherein the check is performed by the memory generating three copies of the parameters, by the microcontroller integrated circuit requesting all of the three copies, checking if all of the three copies are identical, and storing two of those three copies in the internal RAM of the microcontroller integrated circuit if all of the three copies are identical.

9. The monitoring system according to claim 6, wherein the parameters are checked for corruption before utilizing by the microcontroller integrated circuit.

10. The monitoring system according to claim 9, wherein the check is performed by the memory generating three copies of the parameters, by the microcontroller integrated circuit requesting all of the three copies, storing two of those three copies in the internal RAM of the microcontroller integrated circuit, checking if the two copies are identical, and performing a process in which two new copies are generated from the memory and transferred to the internal RAM of the microcontroller integrated circuit to replace the two copies if the two copies are not identical.

11. The monitoring system according to claim 1, wherein the modules further comprise another temperature sensor measuring a die temperature of the temperature sensor.

12. The monitoring system according to claim 11, wherein the modules transmit both the die temperature and the sensed temperature to the hub computer.

13. The monitoring system according to claim 1, wherein the modules are configured to have an operating temperature of approximately −40° C. to +80° C.

14. The monitoring system according to claim 1, wherein the temperature sensor is configured to identify whether the current temperature sensed by the sensor is above a temperature value representative of a temperature rate of increase above a pre-specified threshold.

\* \* \* \* \*